(12) United States Patent  
Liu et al.

(10) Patent No.: US 8,716,139 B2
(45) Date of Patent: May 6, 2014

(54) METHOD OF PATTERNING A SEMICONDUCTOR DEVICE

(75) Inventors: George Liu, Shin-chu (TW); Kuei Shun Chen, Hsin-Chu (TW); Meng Wei Chen, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 36 days.

(21) Appl. No.: 13/409,863

(22) Filed: Mar. 1, 2012

(65) Prior Publication Data

US 2013/0230980 A1 Sep. 5, 2013

(51) Int. Cl.
*H01L 21/32* (2006.01)
*G03F 7/00* (2006.01)

(52) U.S. Cl.
USPC .......................................... 438/703; 430/323

(58) Field of Classification Search
None
See application file for complete search history.

(56) References Cited

U.S. PATENT DOCUMENTS

| | | | |
|---|---|---|---|
| 2002/0106587 A1* | 8/2002 | Lukanc et al. | 430/312 |
| 2008/0085592 A1* | 4/2008 | Fujimoto | 438/585 |
| 2010/0151671 A1* | 6/2010 | Demos et al. | 438/619 |
| 2011/0171585 A1* | 7/2011 | Park | 430/323 |
| 2012/0088371 A1* | 4/2012 | Ranjan et al. | 438/711 |
| 2012/0220133 A1* | 8/2012 | Aton et al. | 438/703 |

* cited by examiner

*Primary Examiner* — Zandra Smith
*Assistant Examiner* — Pamela E Perkins
(74) *Attorney, Agent, or Firm* — Lowe Hauptman & Ham, LLP

(57) ABSTRACT

A method of patterning a semiconductor device including dividing a layout into more than one pattern. The method further includes depositing a film stack on a semiconductor substrate, depositing a hard mask on the film stack, and depositing a first photoresist on the hard mask. The method further includes patterning the first photoresist using a first pattern of the more than one pattern. The method further includes etching the hard mask to transfer a design of the first pattern of the more than one pattern to the hard mask. The method further includes depositing a second photoresist over the etched hard mask and patterning the second photoresist using a second pattern of the more than one pattern. The method further includes etching portions of the film stack exposed by a combination of the etched hard mask and the second photoresist.

20 Claims, 3 Drawing Sheets

METHOD OF PATTERNING A SEMICONDUCTOR DEVICE

BACKGROUND

Fabricating integrated circuits or other semiconductor devices involves a sequence of depositing a layer of material, covering the layer with a photoresist, patterning the photoresist to produce a pattern of open areas exposing the material while other areas remain covered by the photoresist. The open areas are etched to produce a pattern in the deposited material. Consistent reproduction of a size, shape and location of the photoresist increases the likelihood the integrated circuits will function as desired.

Insufficient photoresist adhesion limits a resistance of the developed photoresist to peeling or delamination. Peeling and delamination alter the size, shape or location of the photoresist. For example, in some instances, small or narrow photoresist structures peel away from an underlying layer during development thus exposing more of the underlying layer. Peeling is often due to a bonding problem between the photoresist and the underlying layer, or undercutting of the photoresist bonded to the underlying layer along a bottom surface of the photoresist. Undercutting reduces an amount of contact between the photoresist and the underlying layer, thereby further reducing the adhesion therebetween.

Another source of peeling or delamination is the relaxation of the photoresist after development. When internal stresses of the photoresist are relieved, the photoresist retracts resulting in a decreased bonding area between the photoresist and the underlying layer. The reduced bonding area increases the likelihood of peeling or delamination.

BRIEF DESCRIPTION OF DRAWINGS

One or more embodiments are illustrated by way of example, and not by limitation, in the figures of the accompanying drawings, wherein elements having the same reference numeral designations represent like elements throughout. It is emphasized that in accordance with the standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting. For example, the formation of a first feature over or on a second feature in the description that follows includes embodiments in which the first and second features are formed in direct contact, and also includes embodiments in which additional features are formed between the first and second features.

Figure 1:
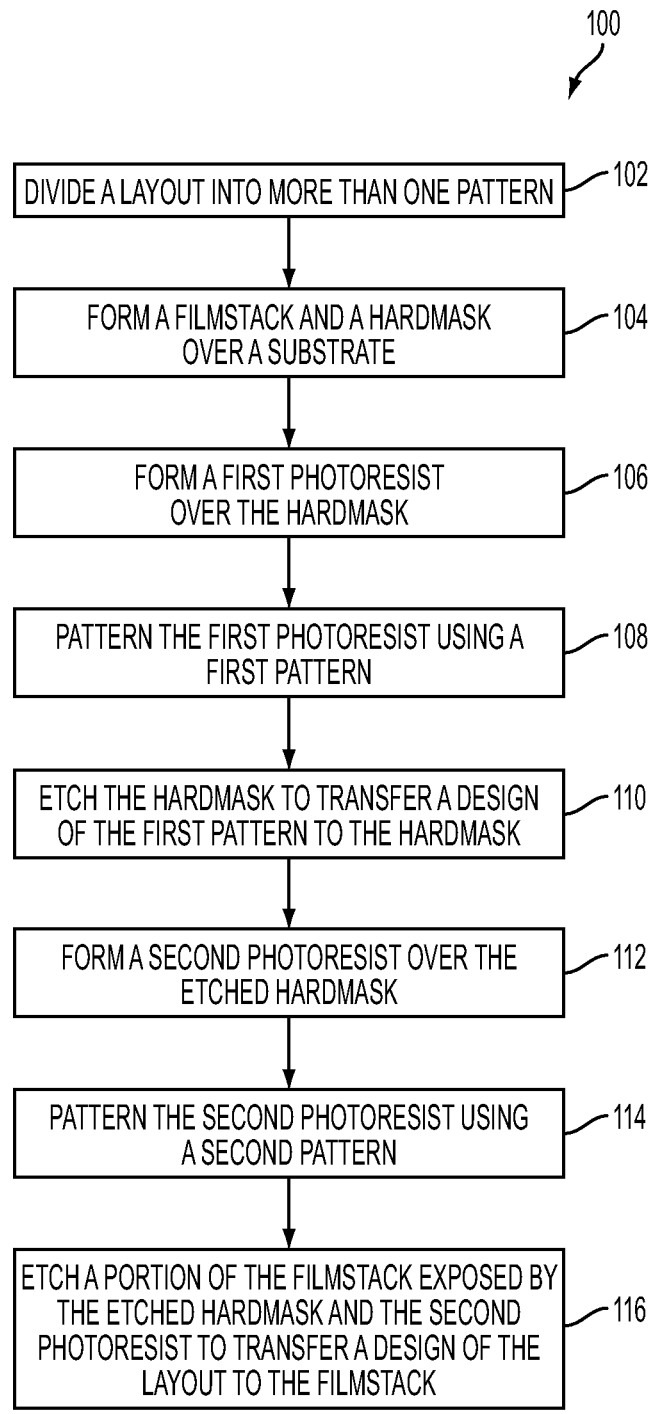
FIG. 1 is a process flow diagram of a method according to one or more embodiments.

FIG. 1 is a process flow diagram of a method 100. An overview of method 100 begins with step 102, in which a layout is divided into more than one pattern. In step 104, a film stack and a hard mask are formed over a substrate. In step 106, a first photoresist is formed over the hard mask. In step 108, the first photoresist is patterned using a first pattern. In step 110, the hard mask is etched to transfer a design of the first pattern to the hard mask. A second photoresist is formed over the hard mask in step 112. In step 114, the second photoresist is patterned using the second pattern. A portion of the film stack exposed by a combination of the hard mask and the second photoresist is etched to transfer a design of the layout to the film stack in step 116.

A detailed discussion of method 100 begins with step 102, in which the layout is divided into more than one pattern. The layout is an overall design of features to be transferred to the film stack. In some embodiments, the layout includes features or spacings between features which are too small to accurately transfer to the film stack using a single pattern. Features or spacings are too small to be transferred in a single pattern when a minimum resolution of the patterning process exceeds the size of the feature or spacing. If features or spacings having a size less than that of the resolution capabilities of the patterning process are patterned using a single pattern, the design has an increased likelihood of overlay of neighboring features or omission of certain features. Overlay or omission of features increase the risk of short circuits or other issues which result in the circuit not functioning as intended.

Figure 2A:
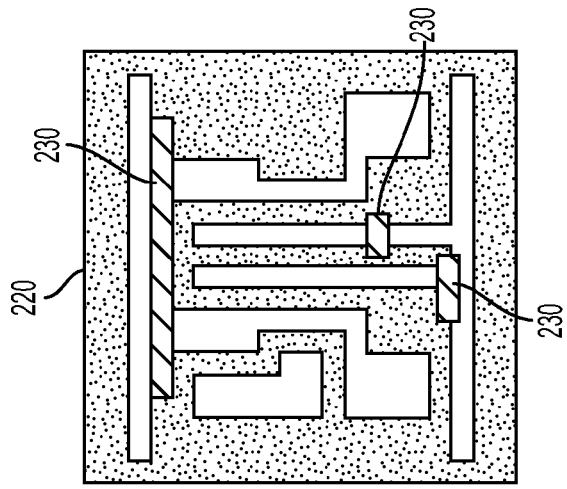
FIG. 2A is a top view of a layout of a design to be transferred to an underlying layer according to one or more embodiments.

To avoid patterning features or spacings having a size below the resolution capabilities of the patterning process, the layout is divided into multiple patterns to accurately transfer the layout to the film stack. In some embodiments, the layout is divided into two patterns. In some embodiments, the layout is divided into more than two patterns. FIG. 2A is an exemplary top view of a layout and FIG. 2B is an exemplary top view of a first pattern of the multiple patterns.

FIG. 2A is a top view of a layout 202. Layout 202 includes several openings corresponding to features to be formed on the film stack. Layout 202 also includes spacings 204, 206, 208 and 210 too small to transfer to the film stack using a single pattern. In some embodiments, layout 202 is divided into two patterns to accurately transfer the design to the film stack.

Figure 2B:
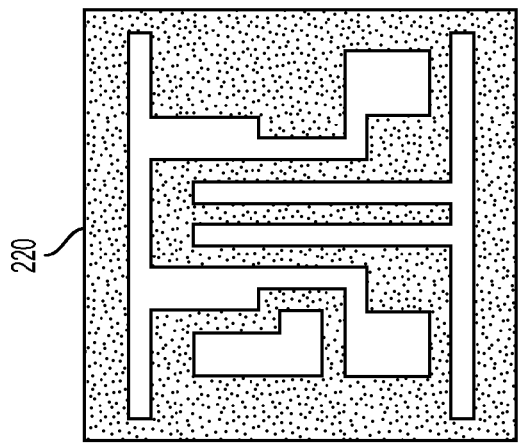
FIG. 2B is a top view of a hard mask having a design of a first pattern, which is a component of the layout of FIG. 2A, according to one or more embodiments.

FIG. 2B is a top view of a hard mask 220 having a design of a first pattern, which is a component of the layout 202, transferred thereto. Hard mask 220 includes openings similar to those of layout 202. However, the design in hard mask 220 omits spacings 204, 206, 208 and 210. In the place of spacings 204, 206, 208 and 210, the openings of hard mask 220 are connected to a neighboring opening(s) with no spacing provided therebetween.

Returning to method 100, in step 104, the film stack and the hard mask are deposited over the substrate. In some embodiments, the substrate is a semiconductor substrate including silicon. In some embodiments, the substrate includes an elementary semiconductor including silicon and/or germanium in crystal; a compound semiconductor including silicon carbide, silicon nitride, silicon oxide, silicon nitride doped with carbon, silicon oxynitride, gallium arsenic, gallium phosphide, indium phosphide, indium arsenide, indium antimonide and/or other nitride or oxide materials; an alloy semiconductor including SiGe, GaAsP, AlInAs, AlGaAs, GaInAs, GaInP, and/or GaInAsP; or combinations thereof. In some embodiments, the film stack includes a single layer. In some embodiments, the film stack includes multiple layers. In some embodiments, the film stack includes a low k dielectric layer. The dielectric constant, k, for low k dielectric materials is less than about 3.5. Low k dielectric materials include aerogel, fluorine-doped silicon oxide, carbon-doped silicon oxide, organic polymer, fluorosilicate glass or other suitable non-electrically conductive materials.

In some embodiments, the hard mask layer comprises silicon nitrides, silicon carbides, silicon dioxide, titanium nitride, tantalum nitride or other dielectric or non-electrically conductive materials. In some embodiments, the hard mask layer comprises a metal layer such as titanium, tantalum, aluminum, or other suitable metal or metal oxide layers.

In some embodiments, the film stack and the hard mask are independently deposited by physical vapor deposition (PVD), chemical vapor deposition (CVD), high density plasma CVD (HDP CVD), plasma enhanced CVD (PE CVD), atomic layer deposition (ALD), sputtering, spin-on coating or the suitable deposition methods. In some embodiments, the film stack and the hard mask are deposited using the same deposition method. In some embodiments, the film stack is deposited using a different deposition method than the hard mask.

In step 106, the first photoresist is deposited over the hard mask. In some embodiments, the first photoresist is a photosensitive polymer such as poly(methyl)methacylate (PMMA), acrylic resin, methacrylate resin, hybride type resin, or other suitable photosensitive polymer. In some embodiments, the first photoresist is a photo acid generator such as sulfonium salt, diazomethane, or other suitable photo acid generator. In some embodiments, the first photoresist is cetyltrimethyl ammonium hydroxide. In some embodiments, the first photoresist is deposited by PVD, sputtering, spin-on deposition or other suitable deposition processes.

In step 108, the first photoresist is patterned using the first pattern. In some embodiments, the first photoresist is patterned using photolithography, electron beam lithography or other suitable patterning technique. In a photolithography process, the first pattern is used as a reticle, in some embodiments. The patterning process transfers the design of the first pattern to the first photoresist.

In step 110, the hard mask is etched to transfer the design of the first pattern to the hard mask. The etching process using an etchant to remove a portion of the first photoresist mirroring the design of the first pattern and a portion of the hard mask underlying the removed portion of the first photoresist. In some embodiments, the etching process is a dry etching process. In some embodiments, the etching process is a wet etching process, a plasma etching process, a reactive ion etching process, or other suitable etching process. In some embodiments, the first photoresist is etched with the same etchant as that used to etch the hard mask. In some embodiments, the first photoresist is etched with a different etchant than that used to etch the hard mask. In an embodiment of FIGS. 2A-2B, following the etching of the hard mask, a top view of the hard mask substantially resembles a top view of the hard mask 220 (FIG. 2B).

The first photoresist is removed following etching of the hard mask. In some embodiments, the first photoresist is removed using a wet chemistry process. In some embodiments, the first photoresist is removed by any one of dry chemistry process, selective etching, plasma ashing, or other suitable methods.

Figure 2C:
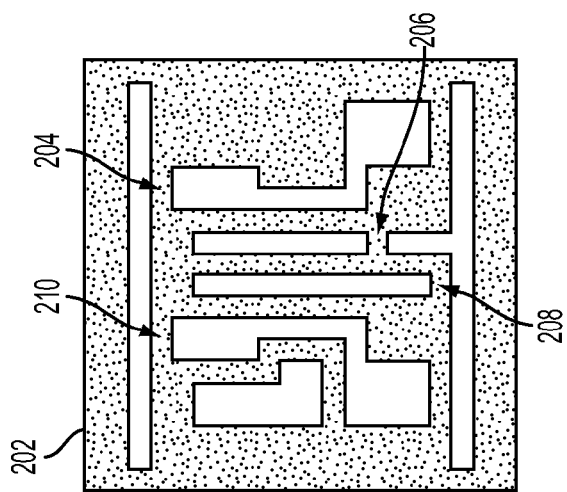
FIG. 2C is a top view of the hard mask of FIG. 2B having a second photoresist formed thereon according to one or more embodiments.

In step 112, the second photoresist is deposited over the patterned hard mask. In some embodiments, the second photoresist comprises the same material as the first photoresist. In some embodiments, the second photoresist comprises a different material than the first photoresist. In some embodiments, the second photoresist is deposited by PVD, sputtering, spin-on deposition or other suitable deposition processes. In some embodiments, the second photoresist is deposited using the same deposition method as the first photoresist. In some embodiments, the second photoresist is deposited using a different method than the first photoresist. FIG. 2C is an exemplary top view of the second photoresist deposited over the hard mask.

FIG. 2C is a top view of hard mask 220 having a second photoresist 230 formed thereon. Second photoresist 230 is formed on portions of hard mask 220 corresponding to the spacings 204, 206, 208 and 210. A combination of hard mask 220 and second photoresist 230 has substantially the same design as layout 202. An etching process performed on an underlying layer through the openings of hard mask 220 with second photoresist 230 further covering portions of the underlying layer will transfer the design of layout 202 to the underlying layer.

In the embodiment of FIG. 2C, second photoresist 230 is formed over hard mask 220 to define spacings. In some embodiments, second photoresist 230 is formed over hard mask 220 to define features.

Figure 3:
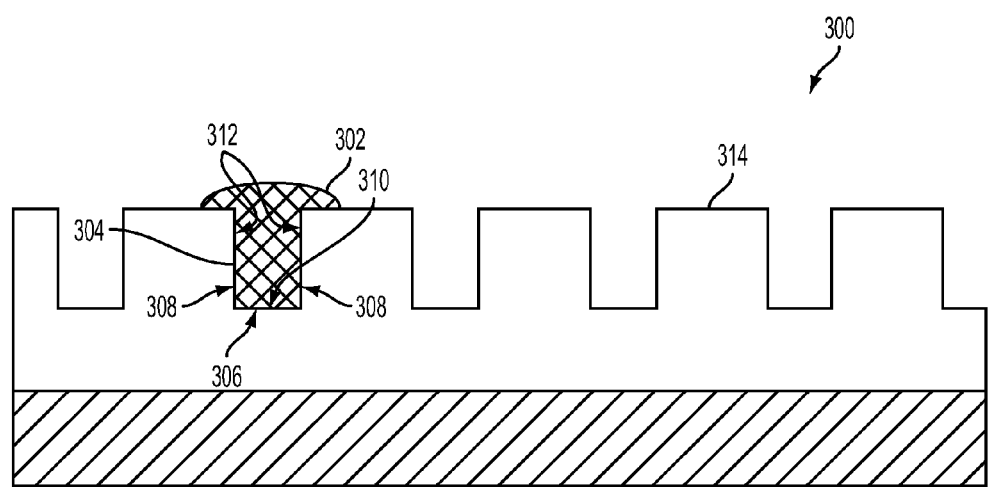
FIG. 3 is a cross sectional view of a photoresist in an opening of a hard mask according to one or more embodiments.

Returning to method 100, in step 114, the second photoresist is patterned using the second pattern. In some embodiments, the second photoresist is patterned using photolithography or other suitable patterning techniques. In a photolithography process, the first pattern is used as a reticle in accordance with some embodiments. In other patterning processes, the second pattern is used as a mask to deposit the second photoresist only over designated portions of the hard mask. The patterning process transfers the design of the second pattern to the second photoresist. In the embodiment of FIGS. 2A-2C, following patterning of the second photoresist, a combination of the hard mask and the second photoresist substantially resembles the combination of hard mask 220 and second photoresist 230 of FIG. 2C. FIG. 3 is an exemplary cross sectional view of the hard mask following patterning of the second photoresist on the hard mask.

FIG. 3 is a cross sectional view of a semiconductor device 300. Semiconductor device 300 includes a photoresist 302 deposited in an opening 304 formed in a hard mask 314. Photoresist 302 includes a bottom surface 306 contacting a bottom 310 of opening 304. Photoresist 302 further includes side surfaces 308 contacting sidewalls 312 of opening 304. Photoresist 302 has a decreased likelihood of peeling compared to a photoresist deposited on a substantially flat surface. The photoresist deposited on the substantially flat surface contacts the substantially flat surface only at a bottom surface of the photoresist, while photoresist 302 contacts opening 304 at side surfaces 308 as well as bottom surface 306. The additional planes of contact between photoresist 302 and openings 304 increases adhesion between photoresist 302 and opening 304.

The increased adhesion enables formation of higher aspect ratio photoresist structures. Aspect ratio is a ratio between a height and a width of photoresist structures. The photoresist deposited on the substantially flat surface has an increased likelihood of peeling above an aspect ratio of about 1.2. Photoresist 302, however, exhibits a low risk of peeling even at aspect ratios above 3.0.

The higher aspect ratio of photoresist 302 enables the formation of smaller features on semiconductor device 300. For example, a predetermined height, or thickness, of photoresist 302 is used to prevent etching through during an etching process. Etching through is when an etchant removes all of photoresist 302 and contacts a portion of the layer under hard mask 314 not intended to be etched. Photoresist 302, having the predetermined height and an aspect ratio of 3.0, has a width 2.5 times smaller than the photoresist on the substantially flat surface having an aspect ratio of 1.2. The decreased width means a spacing or feature formed using method 100 is 2.5 times smaller than is possible using the photoresist on the substantially flat surface.

Returning to method 100, in step 116, the portion of the film stack exposed by a combination of the hard mask and the second photoresist is etched to transfer a design of the layout to the film stack. The etching process uses an etchant to remove a portion of the film stack not covered by the hard mask or the second photoresist. In some embodiments, the etching process is a dry etching process. In some embodiments, the etching process is a wet etching process, a plasma etching process, a reactive ion etching process, or other suitable etching process. In an embodiment of FIGS. 2A-2C, following the etching of the film stack, a top view of the film stack substantially resembles a top view of the layout 202 as in FIG. 2A. <<Question for Inventor: Please confirm etching processes.

The second photoresist and the hard mask are removed following etching of the film stack. In some embodiments, the second photoresist is removed using the same removal process as used with the first photoresist. In some embodiments, the second photoresist is removed using a different removal process than used with the first photoresist. In some embodiments, the hard mask is removed using an etching process or other suitable removal process.

One aspect of this description relates to a method of patterning a semiconductor device including dividing a layout into more than one pattern, depositing a film stack on a semiconductor substrate, depositing a hard mask on the film stack, depositing a first photoresist on the hard mask, patterning the first photoresist using a first pattern of the more than one pattern, etching the hard mask to transfer a design of the first pattern of the more than one pattern to the hard mask, depositing a second photoresist over the etched hard mask, patterning the second photoresist using a second pattern of the more than one pattern, and etching portions of the film stack exposed by a combination of the etched hard mask and the second photoresist.

Another aspect of this description relates to a semiconductor device including a hard mask formed over a film stack, where the hard mask includes at least one opening, and a photoresist formed in one of the at least one opening, where the photoresist substantially fills the one of the at least one opening.

Still another aspect of this description relates to a method of patterning a semiconductor device including dividing a layout into more than one pattern, depositing a film stack on a semiconductor substrate, depositing a hard mask on the film stack, depositing a first photoresist on the hard mask, patterning the first photoresist using a first pattern of the more than one pattern, etching the hard mask to transfer a design of the first pattern of the more than one pattern to the hard mask, depositing a second photoresist over the etched hard mask through a second pattern of the more than one pattern, and etching portions of the film stack exposed by a combination of the etched hard mask and the second photoresist.

While the description is presented by way of examples and in terms of specific embodiments, it is to be understood that the invention is not limited to the disclosed embodiments. To the contrary, it is intended to cover various modifications and similar arrangements (as would be apparent to those skilled in the art). The above description discloses exemplary steps, but they are not necessarily required to be performed in the order described. Steps can be added, replaced, change in order, and/or eliminated as appropriate, in accordance with the spirit and scope of the description. Embodiments that combine different claims and/or different embodiments are within the scope of the description and will be apparent to those skilled in the art after reviewing this disclosure. Therefore, the scope of the appended claims should be accorded the broadest interpretation so as to encompass all such modifications and similar arrangements.

The invention claimed is:

1. A method of patterning a semiconductor device comprising:
    forming a film stack on a semiconductor substrate;
    forming a hard mask over the film stack;
    forming a first photoresist over the hard mask;
    patterning the first photoresist using a first pattern of a layout;
    etching the hard mask to transfer a design of the first pattern to the hard mask, the etched hard mask having a bottom surface;
    forming a second photoresist over the etched hard mask;
    patterning the second photoresist using a second pattern of the layout, the patterned second photoresist defined by the second pattern extending across an entirety of the bottom surface; and
    etching portions of the film stack exposed by the etched hard mask and the patterned second photoresist.

2. The method of claim 1, wherein etching the hard mask comprises etching a metal layer of the hard mask.

3. The method of claim 1, wherein patterning the second photoresist using the second pattern comprises forming photoresist structures having an aspect ratio greater than about 1.2.

4. The method of claim 1, wherein patterning the second photoresist using the second pattern comprises forming photoresist structures having an aspect ratio greater than about 3.0.

5. The method of claim 1, wherein forming the second photoresist comprises depositing the second photoresist in at least one opening in the etched hard mask, and the second photoresist contacts a bottom of the at least one opening and sidewalls of the at least one opening.

6. The method of claim 1, wherein the etching portions of the film stack exposed by the etched hard mask and the second photoresist forms features in the film stack having spacing below the resolution capabilities of a patterning process.

7. The method of claim 1, wherein patterning the first photoresist comprises a photolithographic process, and using the first pattern as a reticle in the photolithography process.

8. The method of claim 1, further comprising removing the first photoresist prior to depositing the second photoresist.

9. The method of claim 1, further comprising removing the second photoresist following etching portions of the film stack.

10. The method of claim 1, further comprising removing the hard mask following etching portions of the film stack.

11. The method of claim 1, wherein forming the first photoresist comprises at least one of the following processes physical vapor deposition (PVD), sputtering or spin-on deposition.

12. The method of claim 1, wherein forming the second photoresist comprises at least one of the following processes physical vapor deposition (PVD), sputtering or spin-on deposition.

13. A method of patterning a semiconductor device comprising:
- forming a film stack on a semiconductor substrate;
- forming a hard mask over the film stack;
- forming a first photoresist over the hard mask;
- patterning the first photoresist using a first pattern of a layout;
- etching the hard mask to transfer a design of the first pattern to the hard mask, the etched hard mask having a bottom surface;
- forming a second photoresist over the etched hard mask; and
- patterning the second photoresist using a second pattern of the layout, the patterned second photoresist defined by the second pattern extending across an entirety of the bottom surface wherein at least one feature of the second pattern is spaced from at least one feature of the first pattern a distance less than a resolution limit of a patterning process.

14. The method of claim 13, wherein etching the hard mask comprises etching a metal layer of the hard mask.

15. The method of claim 13, wherein patterning the second photoresist using the second pattern comprises forming photoresist structures having an aspect ratio greater than about 1.2.

16. The method of claim 13, wherein forming the second photoresist comprises depositing the second photoresist in at least one opening in the etched hard mask, and the second photoresist contacts a bottom of the at least one opening and sidewalls of the at least one opening.

17. The method of claim 13, wherein patterning the first photoresist comprises a photolithographic process, and using the first pattern as a reticle in the photolithography process.

18. The method of claim 13, wherein patterning the second photoresist comprises a photolithographic process, and using the second pattern as a reticle in the photolithography process.

19. A method of patterning a semiconductor device comprising:
- forming a film stack on a semiconductor substrate;
- forming a hard mask over the film stack;
- forming a first photoresist over the hard mask;
- patterning the first photoresist using a first pattern of a layout;
- etching the hard mask to transfer a design of the first pattern to the hard mask;
- forming a second photoresist over the etched hard mask by passing the second photoresist through a mask defined by a second pattern of the layout; and
- etching portions of the film stack exposed by the etched hard mask and the second photoresist.

20. The method of claim 19, wherein depositing the second photoresist through the second pattern comprises forming photoresist structures having an aspect ratio greater than about 1.2.

* * * * *